(12) United States Patent  
Sepehry-Fard et al.

(10) Patent No.: US 8,110,786 B2
(45) Date of Patent: *Feb. 7, 2012

(54) MULTI-ELEMENT CONCENTRATOR SYSTEM

(75) Inventors: Fareed Sepehry-Fard, Saratoga, CA (US); Mohammed Taghi Fatehi, Irvine, CA (US)

(73) Assignee: Ahura Energy Concentrating Systems, Saratoga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/899,475

(22) Filed: Oct. 6, 2010

(65) Prior Publication Data

US 2011/0136020 A1 Jun. 9, 2011

Related U.S. Application Data

(63) Continuation of application No. 12/135,655, filed on Jun. 9, 2008, now Pat. No. 7,834,303.

(51) Int. Cl.
*G01J 1/20* (2006.01)
*F24J 2/10* (2006.01)
*F24J 2/38* (2006.01)

(52) U.S. Cl. ............... 250/203.4; 126/578; 126/600; 126/684

(58) Field of Classification Search ........... 250/203.1, 250/203.3, 203.4; 126/569, 570, 572–577, 126/600, 601, 617, 619, 683–697; 136/206, 136/244, 246; 60/203.1, 641.8, 641.11, 641.12, 60/641.15

See application file for complete search history.

(56) References Cited

U.S. PATENT DOCUMENTS

| | | | |
|---|---|---|---|
| 4,013,885 A * | 3/1977 | Blitz ........................... | 250/203.4 |
| 4,172,443 A | 10/1979 | Sommer | |
| 4,225,781 A * | 9/1980 | Hammons .................. | 250/203.4 |
| 4,276,872 A * | 7/1981 | Blake et al. .................... | 126/578 |
| 4,296,731 A | 10/1981 | Cluff | |
| 4,318,393 A * | 3/1982 | Goldstein ..................... | 126/647 |
| 4,519,382 A * | 5/1985 | Gerwin ........................ | 126/578 |
| 4,683,872 A * | 8/1987 | Fricker ........................ | 126/586 |
| 4,700,013 A | 10/1987 | Soule | |
| 4,706,651 A * | 11/1987 | Yudow ......................... | 126/681 |
| 4,727,930 A * | 3/1988 | Bruckner et al. ............ | 165/111 |
| 4,804,832 A * | 2/1989 | Gardner ..................... | 250/206.1 |
| 4,968,355 A * | 11/1990 | Johnson ........................ | 136/246 |
| 5,131,955 A | 7/1992 | Stern et al. | |
| 5,166,832 A | 11/1992 | Zychowicz | |
| 5,180,441 A | 1/1993 | Cornwall et al. | |

(Continued)

*Primary Examiner* — John Lee

(74) *Attorney, Agent, or Firm* — The Law Offices of Andrew D. Fortney; Andrew D. Fortney; Bradley J. Levang

(57) ABSTRACT

A novel concentrator system is described, which increases the efficiency of collecting and concentrating sunlight energy onto a target. This method uses an array of small movable reflective or refractive concentrator components that can move via a feedback mechanism which tracks the sun and concentrates the suns energy on to a second array of energy converting elements. In order to improve the effective collected energy, the array of concentrator elements is placed on a moving or tiltable flat slab (or dish, substrate, plane, plate, holder, tablet, or similar flat or non-flat surface) that tracks the sun. An alternative method uses an array of target elements or linear elements and a second array of concentrator elements in harmony such that the suns energy is efficiently redistributed by the reflective or refractive array on to the energy converting array as the sun's position in the sky (elevation and azimuth) changes. The elements of the reflective or refractive array are tilted by novel actuation mechanisms describe herein.

20 Claims, 7 Drawing Sheets

U.S. PATENT DOCUMENTS

| | | | | |
|---|---|---|---|---|
| 5,798,517 | A * | 8/1998 | Berger | 250/203.4 |
| 5,979,438 | A * | 11/1999 | Nakamura | 126/680 |
| 5,980,052 | A * | 11/1999 | Thor et al. | 359/877 |
| 6,005,236 | A * | 12/1999 | Phelan et al. | 250/203.4 |
| 6,091,017 | A | 7/2000 | Stern | |
| 6,364,496 | B1 | 4/2002 | Boddy et al. | |
| 6,459,955 | B1 * | 10/2002 | Bartsch et al. | 700/245 |
| 6,485,152 | B2 | 11/2002 | Wood | |
| 6,704,607 | B2 * | 3/2004 | Stone et al. | 700/56 |
| 6,730,840 | B2 * | 5/2004 | Sasaoka et al. | 136/246 |
| 6,957,536 | B2 * | 10/2005 | Litwin et al. | 60/641.8 |
| 6,972,659 | B2 | 12/2005 | Von Behrens et al. | |
| 7,207,327 | B2 * | 4/2007 | Litwin et al. | 126/601 |
| 7,507,941 | B2 * | 3/2009 | Yeh et al. | 250/203.4 |
| 7,567,218 | B2 * | 7/2009 | Whelan | 343/912 |
| 7,692,091 | B2 * | 4/2010 | Altaii et al. | 136/246 |
| 7,709,730 | B2 * | 5/2010 | Johnson et al. | 136/246 |
| 7,795,568 | B2 * | 9/2010 | Sherman | 250/203.4 |
| 7,834,303 | B2 * | 11/2010 | Fatehi et al. | 250/203.4 |
| 7,910,870 | B2 * | 3/2011 | Yeh et al. | 250/203.4 |
| 2003/0070704 | A1 * | 4/2003 | Hart et al. | 136/246 |
| 2004/0031483 | A1 * | 2/2004 | Kinoshita | 126/574 |
| 2004/0159318 | A1 * | 8/2004 | Kinoshita | 126/578 |
| 2006/0124123 | A1 * | 6/2006 | Whelan | 126/696 |
| 2007/0188876 | A1 * | 8/2007 | Hines et al. | 359/642 |
| 2008/0066735 | A1 * | 3/2008 | Yeh et al. | 126/578 |
| 2008/0170312 | A1 * | 7/2008 | Rabinowitz | 359/853 |
| 2008/0256952 | A1 * | 10/2008 | Litwin et al. | 60/641.8 |
| 2008/0299697 | A1 * | 12/2008 | Guerra et al. | 438/57 |
| 2009/0114211 | A1 * | 5/2009 | Homyk et al. | 126/578 |
| 2009/0159074 | A1 * | 6/2009 | Rabinowitz | 126/600 |
| 2009/0174957 | A1 * | 7/2009 | Rabinowitz | 359/851 |
| 2009/0188545 | A1 * | 7/2009 | Rabinowitz | 136/246 |
| 2009/0260619 | A1 * | 10/2009 | Bailey et al. | 126/578 |
| 2009/0302199 | A1 | 12/2009 | Sepehry-Fard et al. | |
| 2009/0314926 | A1 * | 12/2009 | Hinderling et al. | 250/203.4 |
| 2010/0031952 | A1 * | 2/2010 | Zavodny et al. | 126/573 |
| 2010/0059042 | A1 * | 3/2010 | Chang et al. | 126/573 |
| 2010/0252024 | A1 * | 10/2010 | Convery | 126/578 |
| 2010/0275903 | A1 * | 11/2010 | Yeh et al. | 126/578 |
| 2010/0326521 | A1 * | 12/2010 | Rabinowitz | 136/259 |
| 2011/0000478 | A1 * | 1/2011 | Reznik | 126/574 |
| 2011/0101253 | A1 * | 5/2011 | Lal et al. | 250/505.1 |

* cited by examiner

MULTI-ELEMENT CONCENTRATOR SYSTEM

RELATED APPLICATIONS

This application is a continuation of U.S. patent application Ser. No. 12/135,655, filed Jun. 9, 2008 now U.S. Pat. No. 7,834,303, which is incorporated herein by reference in its entirety.

DISCUSSION OF THE BACKGROUND

The sun is a clean, renewable source of energy. One of the effective usages of the sun's energy is concentrating its light on a target via reflective (mirrors) or refractive (lens) concentrators. Sunlight can be concentrated using reflecting mirrors, refraction (lens), parabolic mirror or lens, one big or large number of smaller ones, on a slab, or on double slabs, tiltable, moveable, or with rotation. The target can be a solar cell, water heating reservoir or pipe, fuel cell reactor, photosynthesis element, etc. Power generation for under 1.7 cents/kW·hr could be produced without a toll on the environment.

In order to collect more energy, it is advantageous to keep the alpha ($\alpha$) to a small value, even when the sun is moving, as shown in FIG. 1. This often requires aligning the vertical axis of the reflective or refractive elements toward the sun, such as tilting or moving those elements, when the sun moves.

The following types of concentrators are commonly used to maximize the collected sunlight energy:
1. Reflective or refractive element (panel/surface/plate/dish).
2. Array of small parabolic reflective or refractive elements on a flat-panel (dish).
3. Array of small flat reflective or refractive elements on a parabolic-panel (dish).

All the above panels or dishes usually have tracking systems that track the sun and point the dish toward the sun. The above mentioned concentrators suffer from the fact that large and heavy panels (dishes) need to move constantly to track the sun. Such movement requires electric motors and a gearbox, which consume power and are prone to failure.

SUMMARY OF THE INVENTION

A concentrator system is described, which increases the efficiency of collecting sunlight energy and concentrating it on a target (or targets). This method uses an array of small movable reflective or refractive concentrator components that tilt about or move in two axes (X and Y) via X-direction and Y-direction control processors. The X and Y control processors produce signals proportional to the angle of sun rays to the axis of the concentrator system using a differential tracking system. The array of concentrating elements could be installed on a moving flat slab (dish), which can then track the sun and therefore better align the concentrator elements toward the sun. This method ensures highly efficient concentrating of sun energy through the day from morning until afternoon.

As an alternative to moving the slab (dish), an array of target elements (e.g., photocells) or linear elements (e.g., a pipe) are placed above the concentrator elements, which ensures that the sunlight is concentrated efficiently throughout the day by concentrating the sunlight on different point target elements or different linear target elements when the sun moves.

DETAILED DESCRIPTION OF THE PREFERRED EMBODIMENTS

Three novel types of concentrator systems are described in this document that concentrates the sunlight on to a target very effectively. The target can be a solar cell, a water heating reservoir or pipe, a fuel cell reactor, a photosynthesis element, etc.

Figure 1:
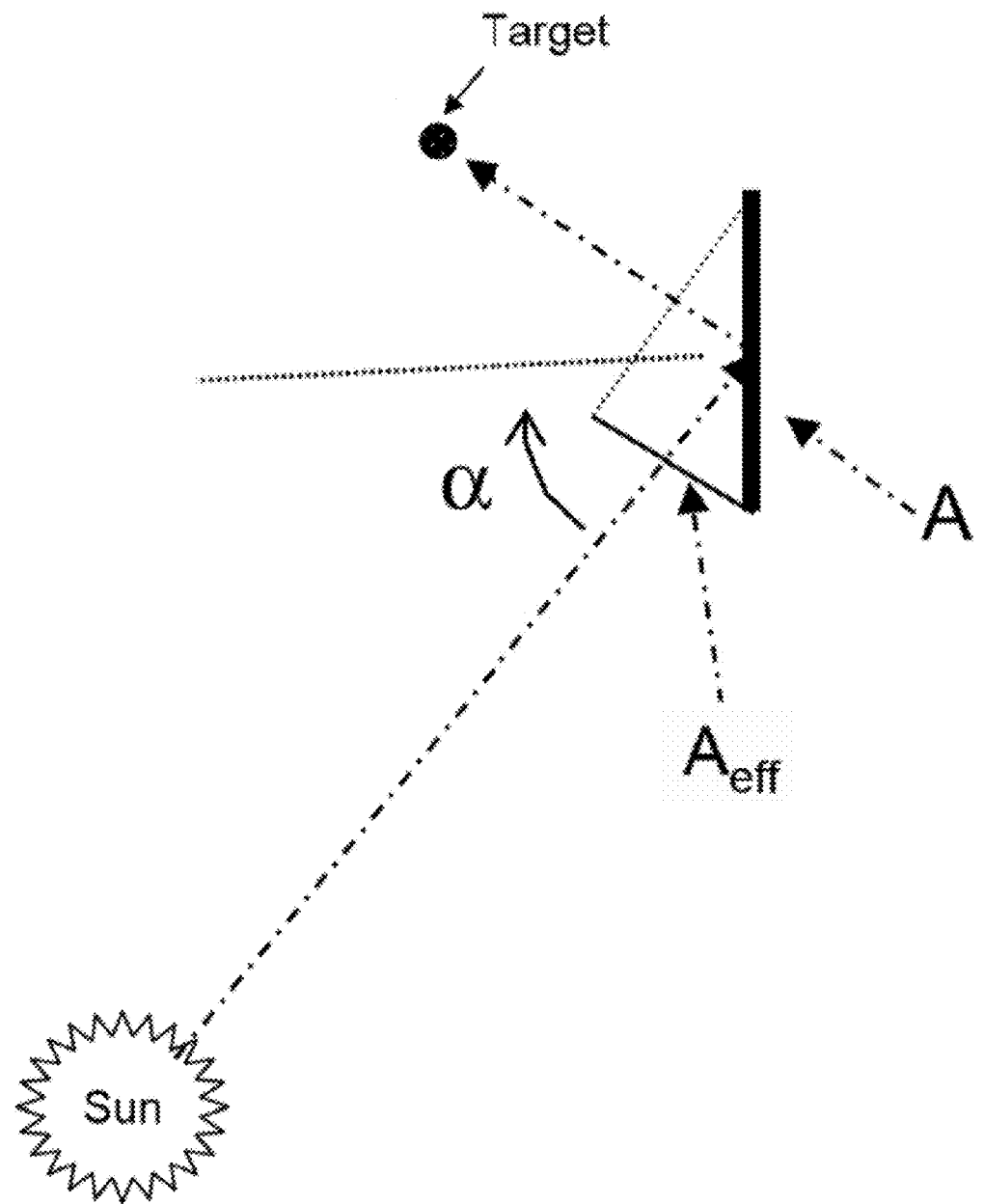
FIG. 1 shows the angle alpha ($\alpha$) and the effective concentrator elemental surface area ($A_{eff}$).
Figure 2:
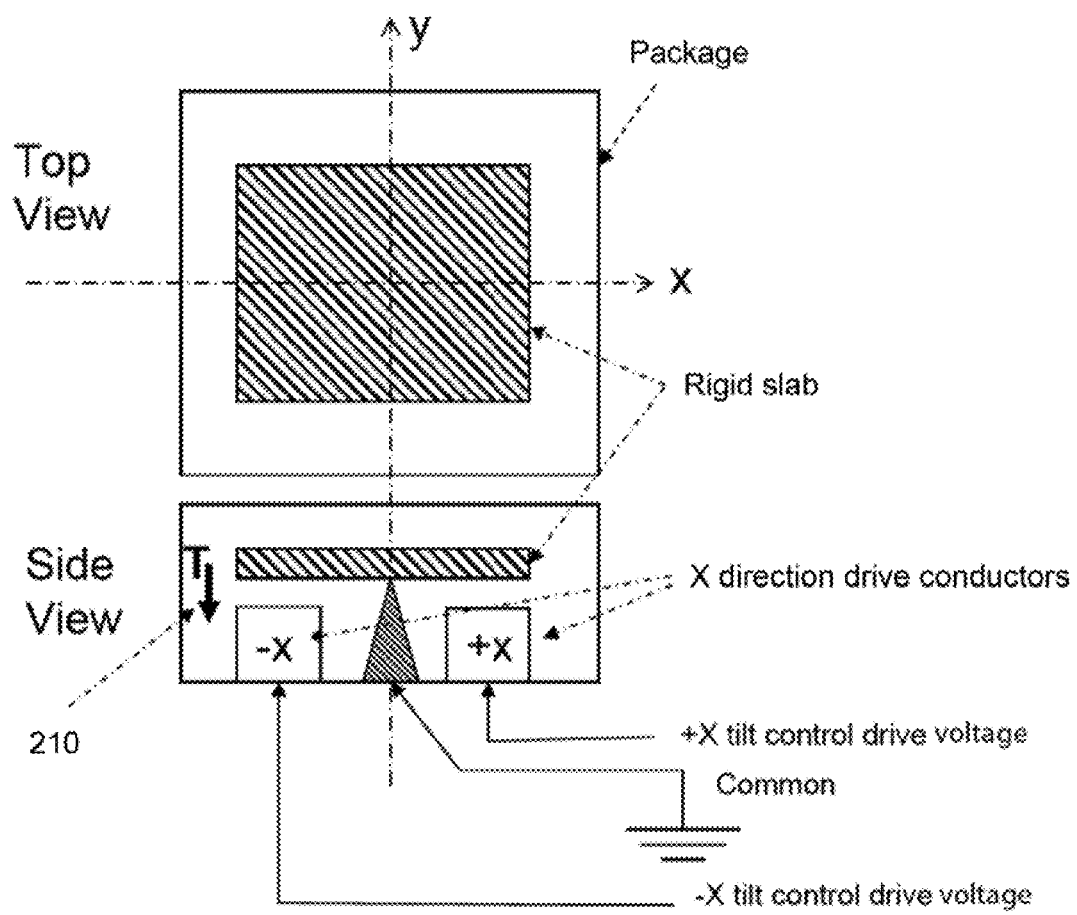
FIG. 2 shows one of the reflective elements that include the slab (mirror) and an electrostatics actuation mechanism for tilting the mirror.

A typical concentrating element (e.g., an electrostatic embodiment) is illustrated in FIG. 2. The concentrator comprises an array of small flat reflective (mirror) or refractive (lens) elements e.g., "Rigid slab") called concentrating elements and a package (which may include electronics). Each concentrating element has a mechanism that can tilt it in one axis or two axes (X and Y). The movement of concentrating elements in X or Y axis are controlled by a feedback mechanism, which aligns the vertical axis of each concentrator system with the sun, while still concentrating the maximum amount of energy on the target (see FIG. 3). Throughout this application, the target may be a solar cell, a water heating reservoir or pipe (for one-dimensional arrays), a fuel cell reactor, a photosynthesis element, etc. A differential tracker is connected to two (or more) photo detectors (PD), which are located at a distance from each other. The differential tracker creates a differential signal that is fed to a tracking and control processor, which in turn commands the X and Y direction control processors to tilt the concentrating elements in the X or Y axis. The advantage of such a concentrating system is that it has smaller moving parts that require very little moving power, and the failure of the moving system of any of the reflective elements has negligible effect on the overall concentrated energy. However, as shown in FIG. 1, this type of concentrator system suffer from the cosine (cos) of alpha ($\alpha$) problem in the early morning or late afternoon, due to the large (azimuth) angle ($\alpha$) of the sun makes with respect to the normal to the concentrator element at the extremes (new sunrise and sunset). This geometry ($A_{eff}=A \cos \alpha$) is shown in FIG. 1.

Figure 3:
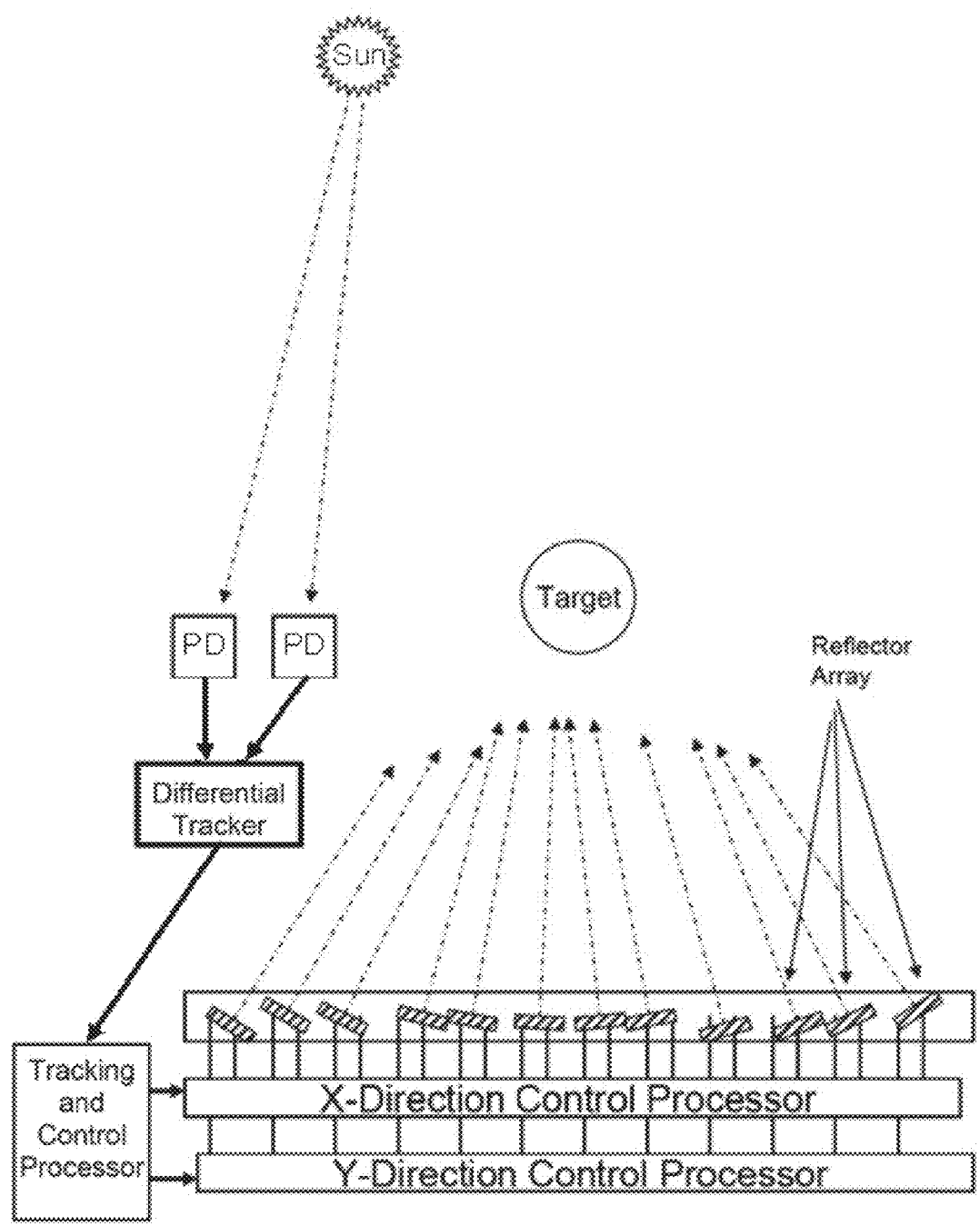
FIG. 3 shows a first type of concentrator system with an array of small mirrors, which are tilted individually, via a feedback mechanism, to track the sun.

FIG. 3 shows the structure of a reflective concentrator system, along with FIG. 2 (showing the concentrator element). It consists of a two-dimensional array of conductive or ferromagnetic materials that has a highly reflective top surface such as ALANOD (available from Alanod Aluminum-Veredlung GmbH & Co., Ennepetal, Germany). There are two X direction drive conductors (see, e.g., FIG. 2), which are connected to +X tilt and −X tilt control drive voltages, as shown in FIG. 2. Each concentrating element may have a tilt (T) that is proportional to the (−X voltage) minus the (+X voltage). In other words, the tilt (T) or an of the rigid slab is the result of a differential electrostatic force or other actuation mechanism 210. One of the following actuation mechanisms is used to tilt the slab:

1) Electrostatic force using two (or one) chargeable plate(s). The differential electrostatic force (210) will tilt each mini-mirror to the desired angle under feedback control.
2) Magnetic force using two (or one) solenoid(s). The differential magnetic force, combined with appropriate spring tensions, will tilt each mini-mirror to the desired angle under feedback control.
3) Servo control mechanism using one (or more) miniature motor(s). The miniature electric motor(s), combined with spring tensions (with dampers), will tilt each mini-mirror to the desired angle under feedback control.
4) The strain experienced in alloys called shape memory alloys (SMA), also known as "muscle wire," as a result of controlled heating and other excitations.

Clearly, there are other actuating mechanisms that are also possible and can be envisioned by someone skilled in the art.

Figure 4:
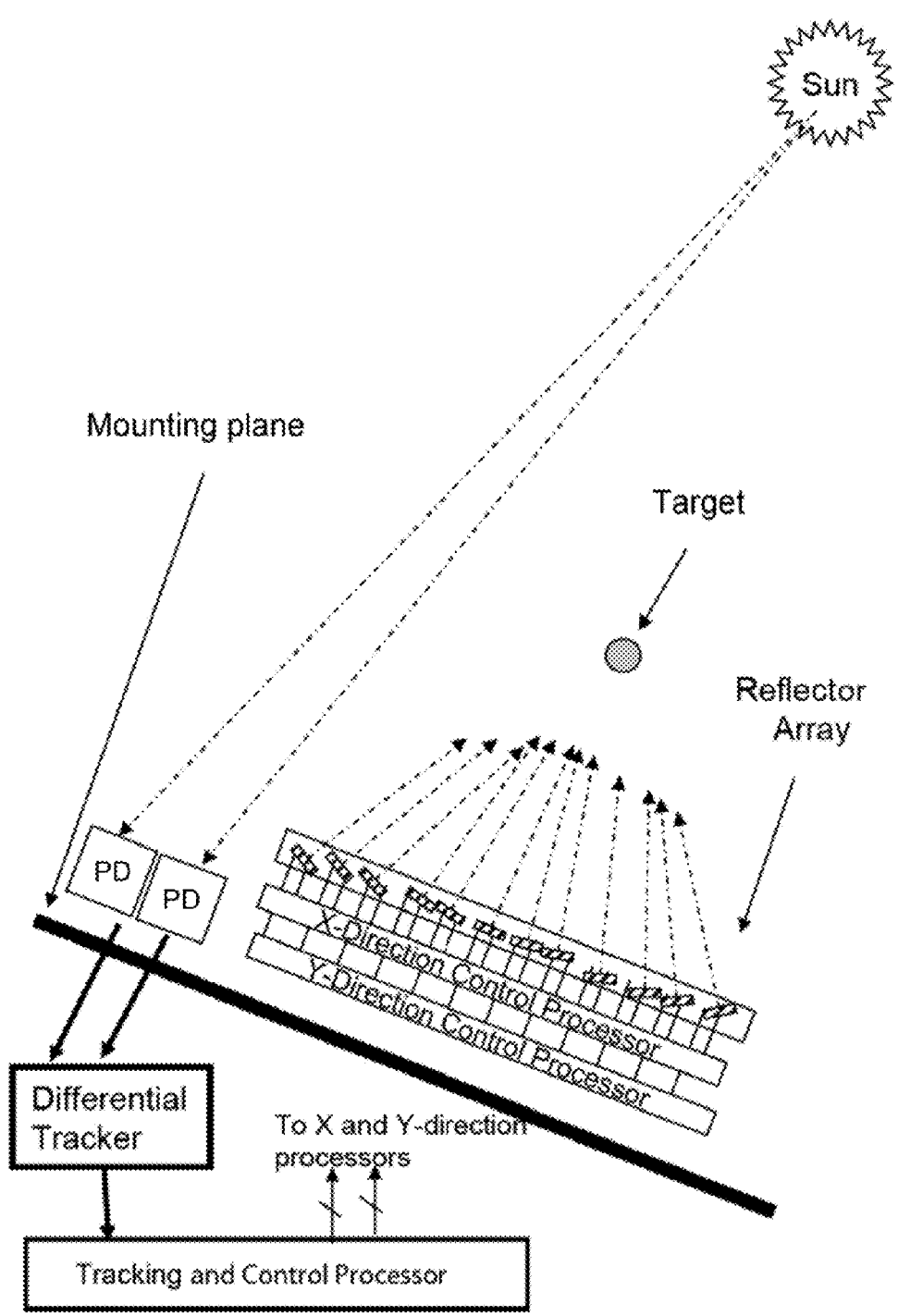
FIG. 4 shows a second type of concentrator system with an array of small mirrors and a movable or tiltable slab (dish). Individual mirrors, as well as the dish, are tilted via a feedback mechanism to track the sun.

The second concentrator system is illustrated in FIG. 4. This concentrator is similar to the first concentrator shown in FIG. 3, and comprises of the same elements and components, but in this concentrator system a flat panel (dish, or "Mounting plane") holds the small concentrator elements. The dish is movable and tracks the moving of the sun in such a way that roughly aligns the vertical axis of the dish with the sunlight. The moving of the dish results in a lower angle (e.g., alpha) between the sunlight and the vertical axis of the small concentrator elements, which causes more energy to be concentrated on the target (e.g., a solar cell), and therefore increases the efficiency of the whole concentrator system. In this embodiment, the concentrator (array) elements perform the functions of fine alignment or tracking, as well as focusing the energy onto the target.

The third concentrator system consists of an array of concentrators similar to the first and second concentrator systems shown in FIGS. 3 and 4 (e.g., double array arrangements). The third concentrator system comprises an array of target elements and another array of concentrator elements separated by a distance in the Z direction. The target is also a single or two-dimensional array of targets such as an array of solar cells or a linear target element such as a heat pipe for a thermal plant, in which a fluid runs and absorbs the generated heat as a result of solar concentration.

Figure 5:
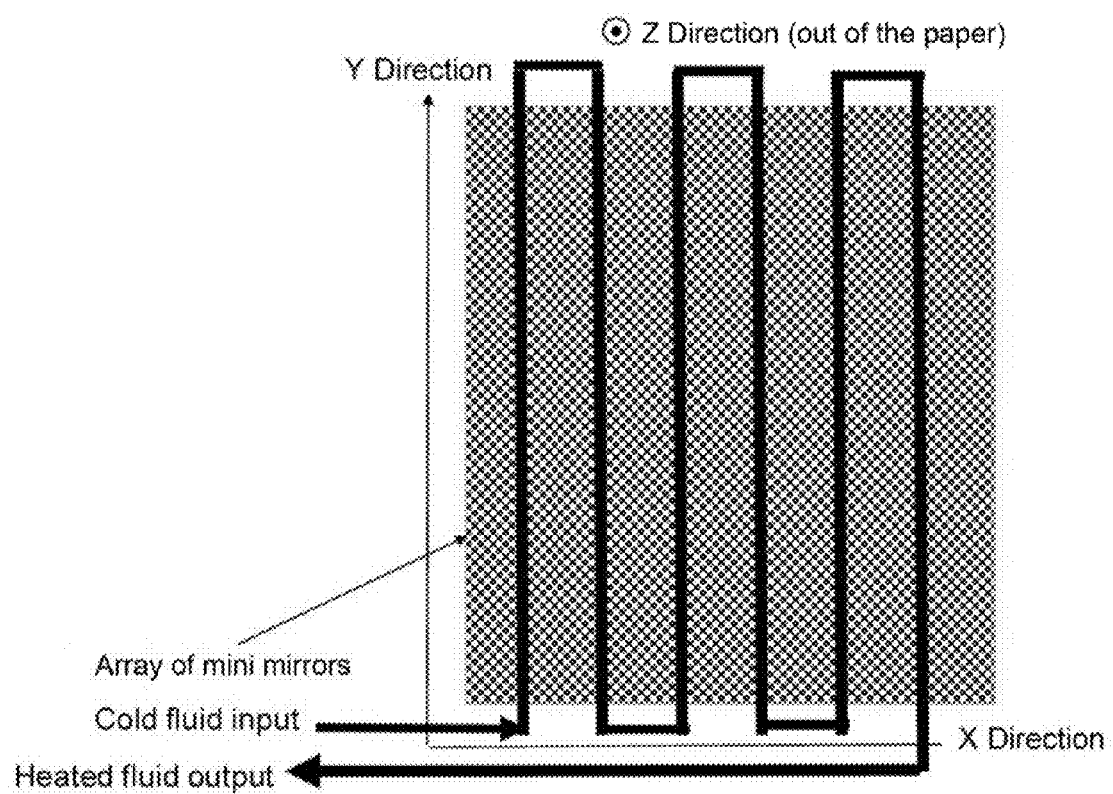
FIG. 5 shows a third type of concentrator system made up of an array of mirrors, with a re-circulating fluid pipe above it as a linear target to absorb the reflected energy from the mirrors.
Figure 6:
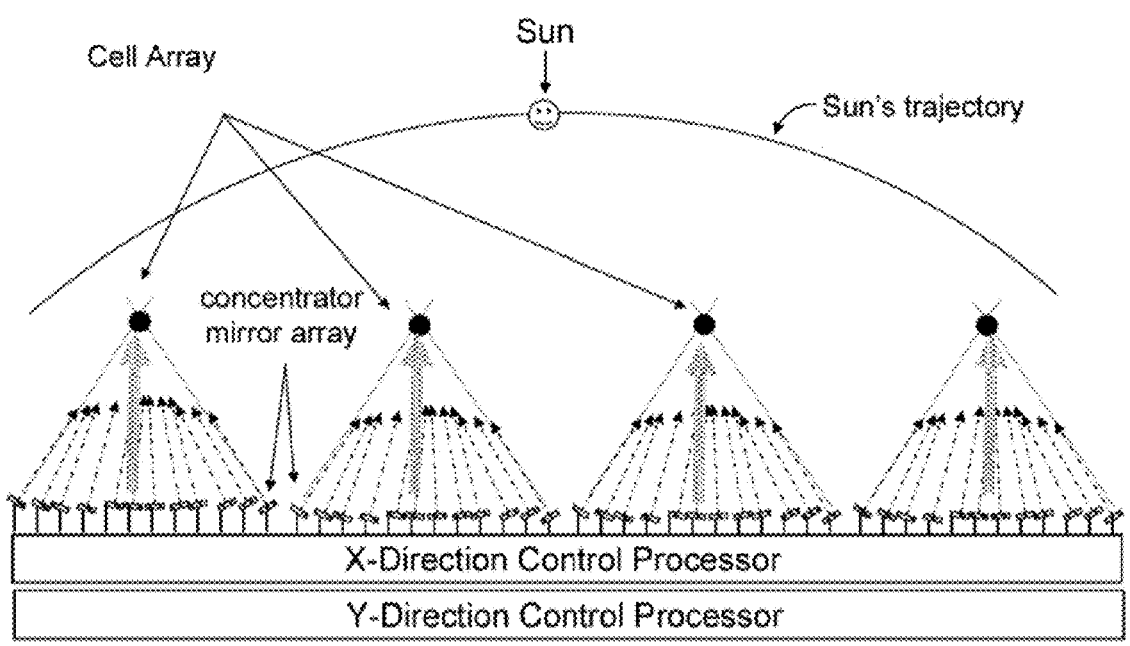
FIG. 6 shows the operation of a concentrator system, the position of the sun in midday in its trajectory of the apparent or relative movement, spanning from left to right, east to west, in the sky.

FIG. 5 shows an example of a two dimensional linear concentrator array of heat pipes used for energy generation, such as in a power plant. The elements to be heated are not points (e.g., cells), but rather lines (e.g., pipes). The dimensions of pipes in one of the directions (the y direction as shown in FIG. 5) are much larger than the dimensions of the cells, so that one needs to focus only in one direction, and there is no need to focus on the second orthogonal direction, along the length of the pipe. These pipes have fluid (liquid) running through them that is used to absorb the concentrated heat, which could then be used in thermal power pants. FIG. 5 shows the top view of such a concentrator system from the Z axis. FIG. 6 shows the side view of such a concentrator system, when the sun is in the south sky, right above the target array at high noon. As the sun moves along its trajectory from the east to the west (as seen from the Earth), the alignment of each mini-mirror to the target element changes, to maximize the sun's irradiance on the surface.

Figure 7:
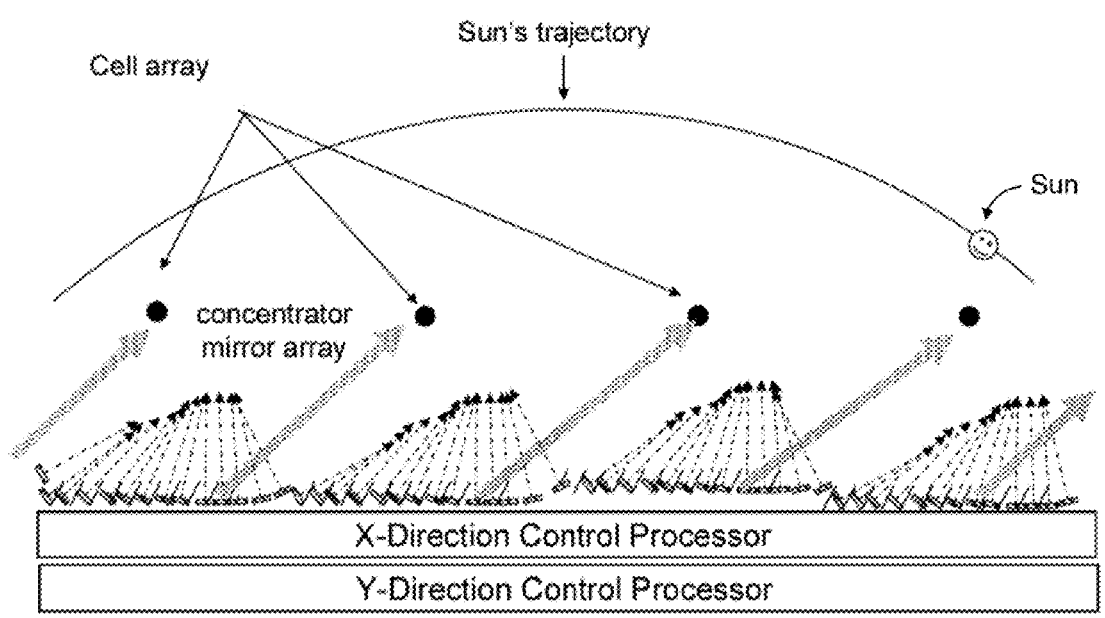
FIG. 7 shows the operation of a concentrator system, the position of the sun in sunset in its trajectory of the apparent or relative movement, spanning from left to right, east to west, in the sky.

FIG. 7 shows the same scenario, but near sunset when the sun is in the west (e.g., at a westerly point). Since there is no moving dish or slab in this type of concentrator system, the optimum tilt for the concentrating elements may not result in the sun rays being concentrated on the same target (i.e., the target area or point that they pointed to at noon time, as shown in FIG. 6). Rather, the optimum tilt of the concentrating elements will concentrate the rays on one of the neighboring target areas or points on the target array, and some concentrator elements will have switched their targets relative to FIG. 6. This technique is very effective, especially when the target is a linear target element such as a heat pipe, since concentrating the sunlight to anywhere in the pipe would still heat the fluid in the pipe. Similar to the first concentrator system shown in FIG. 2, the advantage of such a concentrating system is that it has smaller moving parts that require very little moving power, and the failure of the moving system for any of the reflective elements has negligible effect on the overall concentrated energy, and hence generates power. However, the advantage of the third type of concentrator system described above compared to the first concentrator system is that it does not suffer from the "cosine of alpha" problem, in the morning or afternoon when the alpha angle is large.

Different actuation methods can be used to tilt each element of the concentrator arrays in any direction. Mirror arrays on a rotating slab can be used. The double arrays of mirrors and cells can be used. One embodiment concerns with an apparatus or method to provide for an "Energy Transceiver," which relates to the magnetic motor/generator based on permanent magnets and/or electromagnets. It also addresses a software-defined "Energy Transceiver," magnetic motor or magnetic-based generator, by means of permanent magnets and/or electromagnets in an attraction and/or repulsion mode. It also relates to the means to monitor the permanent magnet force to provide for high power voltage to renew or increase the magnetic force within the magnet, using the solar cells' energy built up within a storage device, including, but not limited to, a huge capacitor.

Another embodiment would utilize electrostatic forces to tilt the elements as shown in FIG. 2. Yet another embodiment of the tilt actuation utilizes certain alloys called shape memory alloys (SMAs), also known as a "muscle wire." In SMAs, a significant amount of strain is experienced as a result of controlled heating and other excitations of the alloy. The differential strain in a number of such actuators would be used to accurately position the tilt angles of each concentrator element.

Clearly, there other actuating mechanisms that also are possible and can be envisioned by someone skilled in the art.

A tracker may be synchronized with an atomic clock in Colorado and a GPS signal. In the case of the atomic clock, a very inexpensive AM or FM modulation (but not limited to these two) can send signals to the tracker via UHF broadcast transmitters or paging networks (but not limited to these two), every ½ hour or so, to enable the tracker to adjust itself to the sun. The same alignment can be done using the weak signal of the GPS, which can be as little as −134 dBm (but not limited to this number), to synchronize the tracker to align the sunshine to the concentrator system.

A database that according to the geographical location of the concentrator and the time of the year will adjust the concentrator system to the sun. There are very mature databases available that portray the location of the sun as a function of the time of the year and geographical location of the concentrator. This embodiment may be self sustaining and can work independently, and all of the information required to align the concentrator reside in the database software in the concentrator. In addition, there is a simple comparator which will receive periodic signals either though the GPS receiver from the GPS satellite, or from the atomic clock, and then align the concentrator to the sun in order to obtain maximum efficiency and output from the concentrator system.

Material and means to deposit/spray anti-sticking material onto the concentrator surface against bird droppings and other man-made or non-man-made unwanted deposits on the surface of the concentrator system, by periodic checking of the output of the concentrator through a monitoring device and/or sensing device output and/or output of the concentrator system, and then taking corrective action which may mean releasing, cleaning, wiping, or spraying the anti-sticking coating material or cleaning agent onto the surface of the concentrator system.

A robot that will periodically clean and/or spray the surface of the concentrator, like a windshield wiper of a car, can be a function of time and/or a function of the sun intensity onto the concentrator, which can be sensed by a sensor or acted on through a servo controller, which monitors the output and adjusts the input (adjusting the input can mean triggering an action to wipe off the surface of the concentrator and/or spraying on the surface of the concentrator, in order to provide additional and better sun irradiance onto the surface of the concentrator and hence obtain higher output from the concentrator system).

Photosynthesis, electrolysis (separating hydrogen for fuel cells), boiler or steam power generation, and water distillation (such as separation of salt from sea or ocean water by applying intensified sun energy onto a container [but not limited to a container] and using or monetizing the steam power and salt as the residue of this action) should be mentioned as uses or applications of a concentrator. This is in addition to concentrating the sunlight onto a solar concentrator cell for producing electrical energy from sunlight energy.

Make-Up and Advantages of the Multi-Element Solar Concentrating System, as an Example It consists of an array of thousands of relatively small flat glass mirrors.

The mirrors that reflect the sunlight move (tilt) in two dimensions to follow the sun during the day and during the seasons. The glass used in the mirrors is less expensive because it is nearly flat and not curved. In addition, solar fields can be installed on uneven or sloping ground.

Inverter attributes should be:
Fast Maximum Power Point Tracking (MPPT) process
High efficiency achieved through robust power train and control architecture
Elimination of cascaded power failure throughout the PV system
Simplification of balancing of the system
Low cost installation
Easy integration to build integrated photovoltaic systems

Magnetic Powered Apparatus for Actuating the Mirrors

The importance of correct dimensioning of the armature magnet cannot be overemphasized. If it is either too long or too short, it could achieve an undesirable equilibrium condition that would stall movement. The objective is to optimize all force conditions to develop the greatest possible off-balance condition, but always in the same direction as the armature magnet moves along the row of stator magnets. However, if the armature is rotated 180 degrees and started at opposite end of the track, it would behave in the exact same manner, except that it would in this example move from left to right.

Also, note that once the armature is in motion, it has momentum that helps carry it into the sphere of influence of the next pair of magnets, where it gets another push and pull, and additional momentum. This was addressed by the prior art. Computer analysis and a feedback system can help provide vital feedback information that greatly helps in the effort to optimize these complex forces to achieve the most efficient possible operating design. The applications of such an apparatus include, but are not limited to, what is originally intended to be and can certainly expand to cars, planes, trains, generators, motors, power plants, photosynthesis, electrolysis (separating hydrogen for fuel cells), and boiler or steam power generators, but not limited to these uses or applications of the magnetically aligned solar concentrating system.

The $/w and/or $/kW·hr figure of merits will be satisfied and reduced significantly in order to avail the energy at significantly lower cost than even nuclear and/or coal sources of energies. Advantageously, the present invention enables less than 1.7 cents/kW·hr of energy production.

Pressurized Caverns

The great limiting factor of solar power, of course, is that it generates little electricity when skies are cloudy, and no electricity at night. Excess power must therefore be produced during sunny hours and stored for use during dark hours. Most energy storage systems such as batteries are expensive or inefficient. Compressed-air energy storage has emerged as a successful alternative. Electricity from photovoltaic plants, such as the system proposed in this patent application, compresses air and pumps it into vacant underground caverns, abandoned mines, aquifers and depleted natural gas wells. The pressurized air is released on demand to turn a turbine that generates electricity, aided by burning small amounts of natural gas. This is also addressed by the prior art.

Large utility power plants require in excess of 1 GW of output, which will provide for (e.g., based on Germany's feed in tariff rates of 50 cents/kW·hr to 75 cents/kW·hr, $/W figures equate to ~$10/W to $15/W) $10B to $15B of revenue. A typical 4-bedroom, 2½-bathroom house in California approximately uses 2 MW·hrs of electricity on an average basis, for a cost of approximately $240/month or ~12 cents/kW·hr based on traditional energy supplies, such as coal or nuclear, which means 1 GW of output power will satisfy power requirements of ~10 million 4-bedroom, 2½-bathroom houses. At 500 suns, each 1×1 $cm^2$, 35% efficient multi junction solar concentrator cell provides for approximately 15 watts. Therefore, one will need 1 GW/15 W=66.7 M 1×1 $cm^2$ cells to provide for 1 GW of output, or 1.34 M 4-inch triple junction concentrator cells with 62% yield, or 50 MOCVD reactors, at a cost of $3 M each, for a total of $150 M. This throughput can be satisfied with only one production solid phase epitaxy reactor, at a cost of $7 M for the reactor, which is more than 21 times less capital intensive and costly than its competition, which is a MOCVD reactor.

In one embodiment, the system comprises of an array of inverters. An alternative method uses an array of target elements or linear elements above the array of concentrator elements. In another embodiment, laser or wireless technology may be used to transfer the energy. The system can also manage, switch, bill, or regulate the energy.

Any variations of the above teaching are also intended to be covered by this patent application.

The invention claimed is:

1. A system for concentrating sunlight, said system comprising:
    an array of reflective elements, refractive elements, or a combination thereof, each of said reflective elements and said refractive elements comprising (i) a rigid slab comprising a conductive material that has a reflective or refractive top surface and (ii) a tilt mechanism that tilts said rigid slab, said tilt mechanism comprising an X-direction actuation mechanism and a Y-direction actuation mechanism;
    at least two photodetectors located a distance from each other;
    a differential tracker receiving signals from said photodetectors and generating a tracking signal related to or proportional to said signals from said photodetectors;
    a tracking and control processor receiving said tracking signal from said differential tracker and controlling said tilt mechanisms such that said rigid slabs are tilted in the X-direction and the Y-direction in response thereto; and
    a target that coverts sunlight to another form of energy, configured to absorb energy reflected from the reflective elements, the refractive elements, or the combination thereof.

2. A system as recited in claim 1, wherein said tilt mechanism comprises a servo mechanism that moves said rigid slab using an electric motor or a step motor.

3. A system as recited in claim 1, wherein said tilt mechanism comprises (i) a hydraulic mechanism or (ii) a shape memory alloy that changes shape due to heat, current or other excitation.

4. A system as recited in claim 1, wherein said tilt mechanism comprises a feedback mechanism configured to align a vertical axis, a horizontal axis, or said vertical axis and said horizontal axis of said system toward the sun.

5. A system as recited in claim 1, wherein said differential tracker is synchronized with an atomic clock, a GPS, a database, or a combination thereof.

6. A system as recited in claim 1, wherein said tracking and control processor comprises a X-direction control processor and a Y-direction control processor.

7. A system as recited in claim 6, wherein:
    said tracking and control processor generates a X-signal to said X-direction control processor and a Y-signal to said Y-direction control processor,
    said X-direction control processor generates −X and +X signals and feeds −X and +X signals to said X-direction actuation mechanism, and
    said Y-direction control processor generates −Y and +Y signals and feeds said and +Y signals to said Y-direction actuation mechanism.

8. A system as recited in claim 1, wherein said target comprises an array of one- or two-dimensional point targets located at a predetermined distance above said array of reflective elements, below said refractive elements, or above said reflective elements and below said refractive elements, wherein said reflective elements and said refractive elements refract direct the sunlight on one or more of said array of point targets at any given instant in time.

9. A system as recited in claim 1, wherein said target comprises a solar a fuel cell reactor, a photosynthesis element, or a fluid heating reservoir or pipe filled with running fluid and/or vapor.

10. A system as recited in claim 1, wherein said tilt mechanism further moves said rigid slab up and down in a third dimension along a z axis.

11. A system as recited in claim 1, further comprising a robot that cleans, sprays, or cleans and sprays a surface of said reflective elements, said refractive elements, or the combination thereof.

12. A system as recited in claim 11, wherein said robot operates remotely, on-site locally, or both remotely and on-site locally through a sensor, a servo controller, or combination thereof.

13. A system as recited in claim 1, wherein said system uses error correction codes or algorithms to steer, optimize, or align the reflective elements, the refractive elements, or the combination thereof.

14. A method for concentrating sunlight, said system comprising:
    detecting a difference in an angle of sun rays received by at least two photodetectors located a distance from each other;
    generating a tracking signal related to or proportional to said difference in said angle of sun rays;
    tilting an array of reflective or refractive elements in an X-direction and/or a Y-direction towards one or more targets using a tilt mechanism, each of said reflective or refractive elements being on a rigid slab, said tilt mechanism tilting said rigid slabs and comprising an X-direction actuation mechanism and a Y-direction actuation mechanism, said X-direction actuation mechanism and said Y-direction actuation mechanism being responsive to said tracking signal; and
    converting sunlight to another form of energy using said one or more targets.

15. A method as recited in claim 14, wherein said tilt mechanism further comprises a Z-direction actuation mechanism that moves the rigid slabs up and down in a third dimension along a z axis.

16. A method as recited in claim 14, wherein said tilt mechanism comprises a servo mechanism that moves said rigid slab using an electric motor or a step motor.

17. A method as recited in claim 14, wherein said tilt mechanism comprises (i) a hydraulic mechanism or (ii) a shape memory alloy that changes shape in response to application of heat, current or other excitation.

18. A method as recited in claim 17, wherein said tilt mechanism comprises a feedback mechanism to align said reflective or refractive elements toward the sun.

19. A method as recited in claim 14, further comprising synchronizing tilting said rigid slabs using an atomic clock, GPS, a database, or a combination thereof.

20. A method as recited in claim 14, wherein tilting said reflective elements comprises moving said rigid slabs in said X-direction and said Y-direction to a desired angle using a differential electrostatic force under feedback control.

* * * * *